United States Patent
Mett et al.

[19]

[11] Patent Number: 5,952,896
[45] Date of Patent: Sep. 14, 1999

[54] IMPEDANCE MATCHING NETWORK

[75] Inventors: Richard R. Mett, Santa Clara; Robert D. Greenway, Sunnyvale; Gabriel Bilek; Ajey Joshi, both of San Jose, all of Calif.

[73] Assignee: Applied Materials, Inc., Santa Clara, Calif.

[21] Appl. No.: 08/954,376

[22] Filed: Oct. 20, 1997

Related U.S. Application Data

[60] Provisional application No. 60/035,329, Jan. 13, 1997.

[51] Int. Cl.$^6$ ............................................. H03H 7/38
[52] U.S. Cl. ............................ 333/32; 174/52.1; 334/65; 334/85; 336/79; 361/757
[58] Field of Search ................. 333/32, 17.3; 334/65–67, 334/69, 71, 85; 336/79, 90, 123, 223; 174/52.1, 52.3, 52.6; 361/746, 757, 796, 800

[56] References Cited

U.S. PATENT DOCUMENTS

| | | | |
|---|---|---|---|
| 1,708,539 | 4/1929 | Goldsmith | 336/79 |
| 2,341,345 | 2/1944 | Van Billiard | 336/123 |
| 3,265,997 | 8/1966 | Olson | 334/71 |
| 5,305,073 | 4/1994 | Ford, Jr. | 356/338 |
| 5,359,779 | 11/1994 | Polk et al. | 362/184 X |
| 5,545,916 | 8/1996 | Koullias | 336/223 X |

*Primary Examiner*—Paul Gensler
*Attorney, Agent, or Firm*—Raymond Moser

[57] ABSTRACT

A high efficiency radio frequency (RF) impedance matching network containing an "L-type" inductor-capacitor (LC) circuit where the capacitor is a variable capacitor coupled from an input port to ground and the inductor is a variable inductance inductor coupled from the input port to an output port. A blocking capacitor is provided between the inductor and the output port and a ceramic capacitor is coupled in parallel across the variable capacitor. The impedance match is tuned by physically adjusting tuning elements of both the inductor and capacitor. The variable inductor contains an improved inductor tuning element that optimizes current flow in the tuning elements and inductor. To further improve the efficiency of the matching network, the assembly uses an improved enclosure interior finish and various circuit optimization techniques that reduce contributions to match loop resistance.

14 Claims, 4 Drawing Sheets

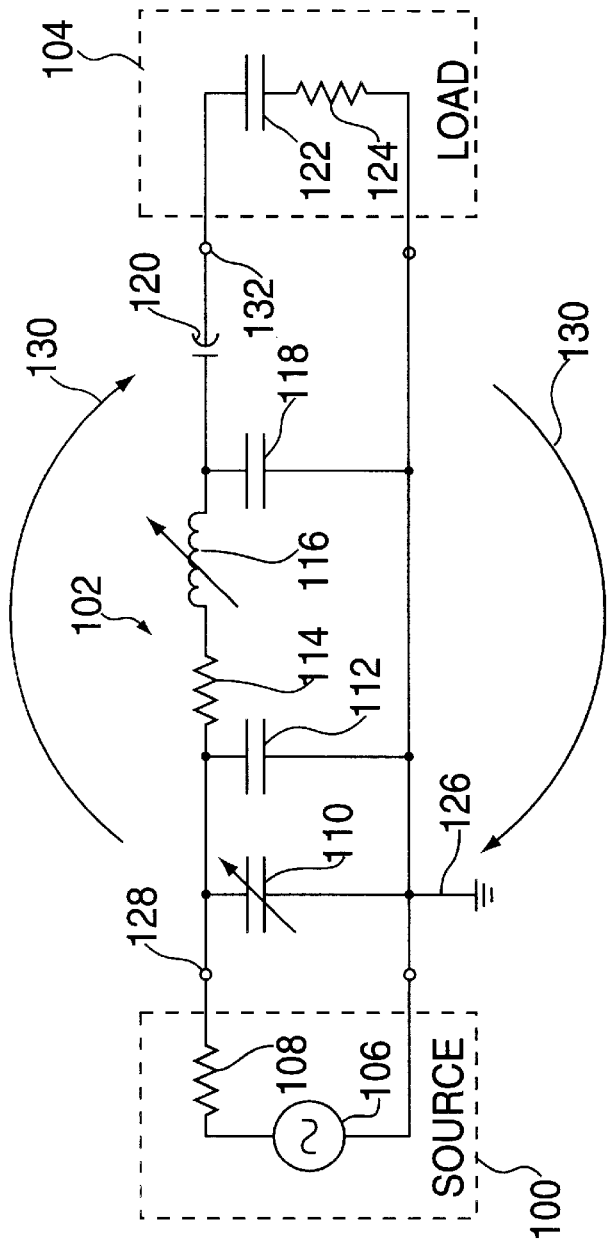
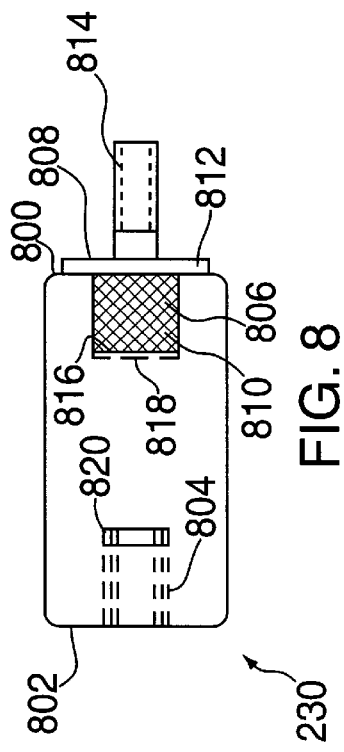
FIG. 1
FIG. 8

IMPEDANCE MATCHING NETWORK

This application claims the benefit of U.S. Provisional Application Ser. No. 60/035,329 filed Jan. 13, 1997.

CROSS-REFERENCE TO A RELATED APPLICATION

This application contains a disclosure that is substantially similar to the disclosure in U.S. patent application Ser. No. 08/954,375, filed simultaneously herewith (Attorney Docket Number 1491-02).

BACKGROUND OF THE DISCLOSURE

1. Field of the Invention

The invention relates to an impedance matching network for matching the impedance of a radio frequency (RF) signal source to the impedance of a load and, more particularly, to high efficiency impedance matching networks.

2. Description of the Background Art

Radio frequency (RF) matching networks are used for coupling RF power, e.g., 13.56 MHz, from an RF source having a substantially resistive impedance (e.g., 50 ohms) to a load having a complex impedance. The matching network matches the source impedance to the load impedance to effectively couple RF power from the source to the load. In high power applications, such as coupling RF or microwave power to an antenna within a communications system, coupling RF power to a plasma within a plasma reaction chamber of a semiconductor wafer processing system and the like, the matching network should be relatively efficient, i.e., the contribution of the matching network to the total a loop resistance should be as small as possible. The resistance of the matching network produces heat and a loss of power coupled through the network. An inefficient matching network requires additional source power to overcome the losses in the matching network and additional cooling requirements to dissipate heat generated within the matching network. Conversely, optimizing the matching network losses results in additional transmitted power to the load. Such additional power provides increased etch rate within a plasma enhanced semiconductor wafer processing system, superior deposition resulting from a physical vapor deposition system, and the like. Empirical study of matching network losses has indicated that optimal network construction should minimize loop resistance and stray capacitances.

Therefore, a need exists in the art for an impedance matching network having improved efficiency.

SUMMARY OF THE INVENTION

The disadvantages heretofore associated with the prior art are overcome by the present invention of a high power, high efficiency radio frequency (RF) impedance matching network. The inventive matching network contains an "L-type" inductor-capacitor (LC) circuit where the capacitor is a variable capacitor coupled from an input port to ground and the inductor is a variable inductor coupled from the input port to an output port. A blocking capacitor is provided between the inductor and the output port and a ceramic capacitor is coupled in parallel across the variable capacitor. The impedance match is tuned by physically adjusting tuning elements of both the inductor and capacitor.

More specifically, the variable capacitor is an air-variable capacitor containing a high efficiency slip ring for optimally coupling power to the capacitor. Specifically, the slip ring contains a bias element and a beveled annulus, where the bias element maintains an apex of the beveled annulus in contact with a contact portion of the rotor, e.g., a copper nut. The copper nut is threaded onto a conductive rotor shaft of the tunable capacitor. As such, RF power is coupled through the bias element, the beveled annulus, the nut and the rotor shaft to reach the plates of the rotor. The beveled slip ring efficiently couples power to the capacitor.

Additionally, to promote efficient coupling of power through the capacitor, the plates of the capacitor are cleaned prior to assembly using a novel cleaning process. In this cleaning process, the plates are degreased in a warm alkaline surfactant, rinsed in water, immersed in aqueous sodium hydroxide, rinsed in water, immersed in diluted nitric acid, rinsed and soaked in water, and lastly blown dry with dry nitrogen or air. This process removes substantially all surface contaminants that would otherwise decrease efficiency of the capacitor.

The variable inductor contains an improved inductor tuning element and coil that optimizes current flow in the tuning elements and inductor. The variable inductor contains a coil having multiple turns and a plurality of tuning elements mounted to a rotatable shaft such that the tuning elements are interspersed between the turns of the coil. More specifically, the inductor coil has a rectangular cross-section, where the long side of the cross-section is parallel to a tuning element. Such a rectangular cross-section minimizes inductor losses when the tuning elements are both engaged and disengaged from the inductor coil. Additionally, the coil is bright etched and sealed with epoxy to remove surface contaminants and avoid recontamination subsequent to assembly. Moreover, the tuning elements are copper clad Fiberglass plates epoxied to a rotatable shaft. As such, the elements are effective in tuning the inductance as well as have low mass to achieve rapid tuning of the inductance. Additionally, the tuning elements have a plan form that is sickle-shaped to optimize current flow efficiency within the tuning element.

To further improve the efficiency of the matching network, the assembly uses an improved enclosure interior finish, e.g., a hard black anodized finish, and various circuit optimization techniques that reduce stray capacitances.

The present invention substantially decreases the losses that have been previously associated with matching networks. When the present invention is used to drive a plasma enhanced semiconductor wafer etching system, the etch rate is improved by 5 to 25 percent over the prior art matching networks, e.g., a P5000 matching network manufactured by Applied Materials, Inc.

BRIEF DESCRIPTION OF THE DRAWINGS

The teachings of the present invention can be readily understood by considering the following detailed description in conjunction with the accompanying drawings, in which:

FIG. 1 depicts a schematic diagram of the impedance matching network of the present invention;

FIG. 8 depicts a stand-off for mounting the coil to the enclosure of FIG. 1.

To facilitate understanding, identical reference numerals have been used, where possible, to designate identical elements that are common to the figures.

DETAILED DESCRIPTION

Figure 2:
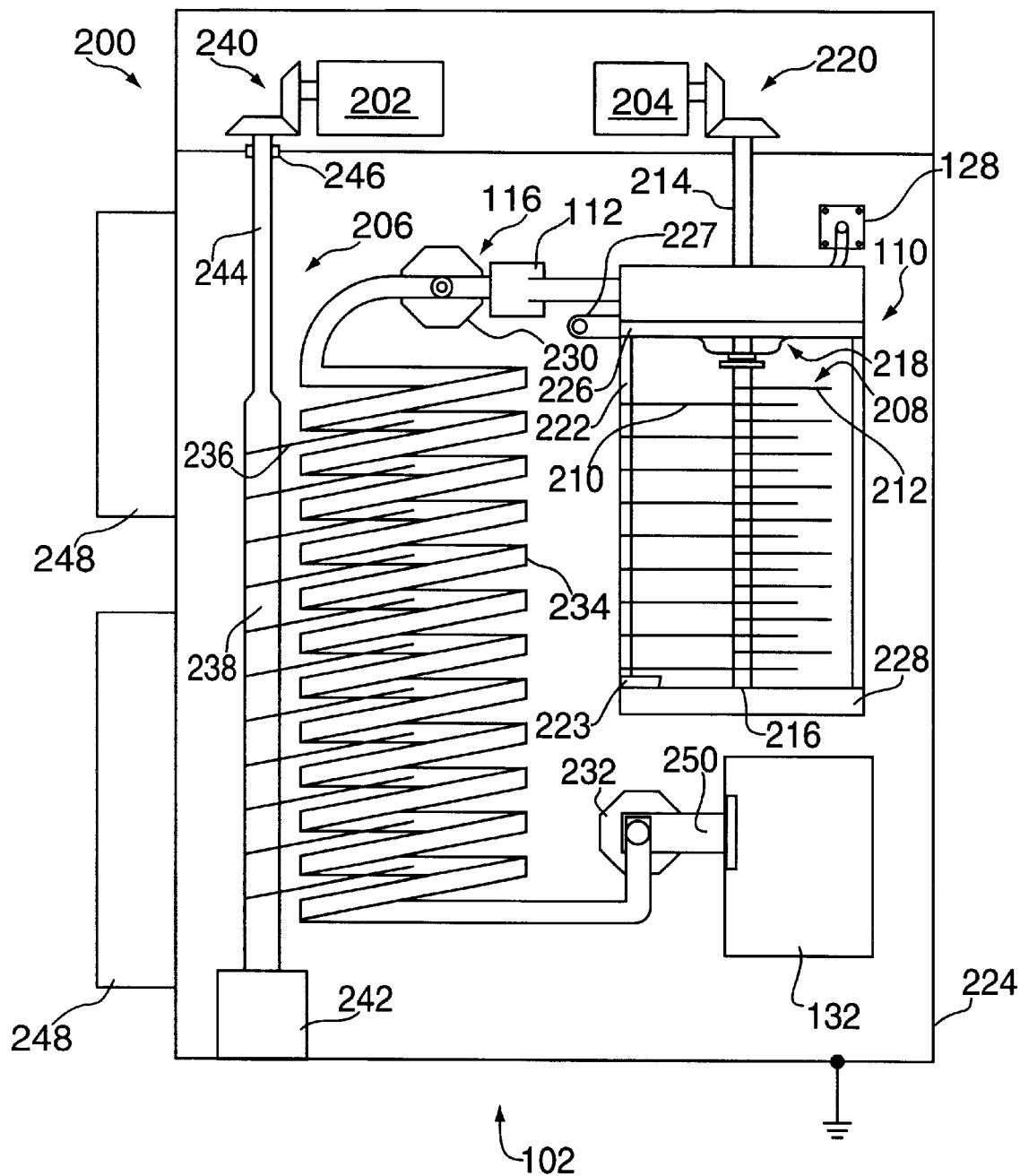
FIG. 2 depicts a perspective view of the impedance matching network of the present invention.

FIG. 1 depicts a schematic diagram of a radio frequency (RF) impedance matching network 102 for coupling RF power from an RF source 100 to a load 104. To achieve efficient operation of the matching network, the match resistance and the stray capacitance of the network must both be minimized. Such minimization is accomplished by efficiently coupling RF power to the various circuit elements, using novel coatings and finishes upon components, and improving inductor tuning element design to improve current flow. To best understand the improvements of the invention, a short tutorial of network fundamentals is presented prior to disclosing the specific inventive elements of the novel matching network.

The RF source 100 has a fixed resistive impedance, e.g., 50 ohms. As such, the RF source is modeled as a AC signal source 106 connected to a series resistance 108. The load 104, for example, is a time-variant, complex impedance such as a plasma within plasma reaction chamber of a semiconductor wafer processing system. The instantaneous load impedance is modeled as a capacitor 122 connected to a series resistance 124. The matching network 102 matches the source impedance to the load impedance with substantially reduced losses as compared to losses associated with prior art matching networks. The matching network of the present invention is mechanically tunable to maintain an optimal match as the load impedance varies.

Specifically, the matching network 102 is an "L-type" RF circuit connected between the source 100 and the load 104. The L-type RF circuit principally contains an air-variable capacitor 110 connected to a variable inductor 116. More specifically, the air-variable capacitor 110 is connected in parallel with the source 100, e.g., connected from input terminal 128 to ground 126. To match an RF signal at 13.56 MHz to a reaction chamber of a semiconductor wafer processing system, the air-variable capacitor has a capacitance that ranges from 30 to 1330 pF and the variable inductor has an inductance that ranges from 1 to 2 $\mu$H. A fixed ceramic capacitor 112 (e.g., 450 pF) is connected in parallel across the air-variable capacitor 110. A match resistance or loop resistance 114 (this resistance is not a physical component, but rather represents the cumulative resistive losses in all component circuitry within the network and their interaction with the enclosure) is connected in series with the source 100. In particular, the resistance is modeled as having a first terminal connected to the input terminal 128. A second terminal of the resistor 114 is coupled to a first terminal of a tunable inductor 116. A second terminal of the inductor 116 is coupled to a blocking capacitor 120 (e.g., 210 pF). The blocking capacitor, in turn, is connected to the load 104. A capacitor 118, representing the stray and parasitic capacitances in the network, is connected from the second terminal of the inductor 116 to ground 126. Arrows 130 represent the instantaneous currents that circulate within the network.

FIG. 2 depicts a perspective view of a tunable RF matching system 200 containing the RF matching network 102 depicted schematically in FIG. 1. The matching network contains components that are interconnected as depicted in the schematic diagram of FIG. 1. In addition to the circuit components of FIG. 1, the system 200 contains a pair of tuning motors 202 and 204 (DC servo motors) that are respectively coupled to the inductor tuning elements 206 and to a rotor 208 of the air-variable capacitor.

Specifically, the air-variable capacitor 110 contains a plurality of stationary (stator) elements 210 (i.e., aluminum blades), a plurality of tuning (rotor) elements 212 (i.e., moveable aluminum blades), an upper frame 226, a lower frame 228, a shaft 214, a conductive stator bus 222, and a slip ring 218. The stator elements 210 are fastened to the conductive stator bus 222 in a parallel, spaced-apart relation to one another. The bus 222 conductively couples the stator elements 210 to one another. The bus 222 is insulated from the lower frame 228 by insulator 223 (e.g., a G-10 spacer). The stator bus 222 is attached to the grounded enclosure 224 via stator contact 227. Although the bus 222 is attached to the upper frame 226, the bus is electrically insulated from the upper frame 226 such that the upper frame can be used as a conductor to propagate the RF signal.

Capacitive tuning elements (rotor blades) 212 are interspersed between each pair of stator blades 210. In a conventional manner, increasing or decreasing the area of each rotor blade that overlaps the stator blade alters the capacitance of the air-variable capacitor 110. The capacitor is illustratively variable from 30 pF to 1330 pF. Each of the rotor blades 272 is attached to the shaft 214 in a parallel spaced-apart relation to one another. Tuning is accomplished by rotating the shaft 214. The shaft 214 is supported at a first end by a conventional ball pivot 216 retained by the lower frame 228 and at a second end by a novel slip ring 218. The shaft extends through the upper housing to a first pinion gear arrangement 220 that is driven by the motor 204. As such, rotation of the motor 204 rotates the shaft to accurately position the rotor elements between the stator elements.

The input terminal 128 (e.g., an N-type connector located on the back of the matching network) is coupled through the upper frame 226 to the slip ring 218. The slip ring couples the source signal to the rotor blades of the capacitor. This signal is coupled to ground through the tunable air variable capacitor 110. The inventive structure of the slip ring 218 is described in detail with respect to FIGS. 3 and 4 below.

Surface contaminants upon the surface of the rotor and stator blades are detrimental to the efficiency of the capacitor. Consequently, these contaminants must be removed from the blades prior to assembly of the capacitor. A novel cleaning process is used to substantially remove all surface contaminants. The blades are first degreased by immersion into a warm (104° F./40° C.) alkaline surfactant (e.g., Oakite 61B) until a water break-free condition is attained. The blades are then rinsed thoroughly in air-agitated, cold tap water. Once rinsed, the blades are inspected for residual oil or other foreign contaminants. If further cleaning is necessary, the blades are re-immersed in the surfactant. When no residual oil remains, the blades are immersed in an aqueous sodium hydroxide solution (3 to 5 ounces per gallon or 80–140 gm per 3.4 liters) at 120–130° F./49–54° C. for 15 to 20 seconds. The blades are then rinsed in air-agitated, cold tap water for three minutes. The blades are further cleaned by immersion and agitation in nitric acid (10–30%) diluted with de-ionized (DI) water for 30 seconds. Thereafter, the blades are rinsed in cold DI water for 30 seconds, then soaked in hot (110–115° F./45° C.) DI water for 3 minutes. Care must be taken not to exceed a water temperature of 115° F./45° C. Lastly, the blades are blown dry using 0.1 micron filtered, dry nitrogen or air. At this point, the blades are sufficiently clean and ready for assembly.

The slip ring 218 of the capacitor is conductively coupled to a first terminal of the ceramic capacitor 112. The ceramic capacitor 112 has an approximate capacitance of 450 pF. The second terminal of the capacitor 112 is connected to the grounded enclosure 224.

The first terminal of the capacitor 112 is coupled to the variable inductor 116. The inductor 116 is spaced from the enclosure by first and second insulated standoffs 230 and 232. The details of the standoffs are described with respect to FIG. 8 below.

The variable inductor 116 contains a coil 234, a plurality of tuning elements 236, and a shaft 238. The coil is fabricated from oxygen-free high-density copper (OFHC) that is bright etched and epoxy coated. The RF skin effect at 13.56 MHz results in current being concentrated to a depth of 0.7 mil into the copper of the coil. Such a shallow skin depth requires surface contaminants to be removed or the contaminants will interfere with current flow. As such, the coil is bright etched to remove contaminants and then the coil is epoxy coated to ensure that contaminants will not redeposit on the copper surface after assembly.

To further improve the inductor's efficiency, the resistance at the surface of the coil is lowered by widening the interior vertical surface of the coil facing the centerline and widening the horizontal surface of the coil, i.e., the surface facing the tuning elements. As such, the coil has a substantially rectangular cross section. The shaft 238 is rotatably supported at a first end 242. A second end 244 of the shaft 238 extends through a bushing 246 to a second pinion gear arrangement 240. The pinion gear arrangement is driven by motor 202 to rotate the shaft 238. The details of the inventive variable inductor 116 are disclosed with respect to FIGS. 5, 6 and 7 below.

The standoff 232 couples the coil to the output terminal 132. A conductor 250 overlaps the end of the coil and is bolted thereto. As such, the RF signal is coupled from the coil to conductor 250. Conductor 250 couples the signal to the output circuitry and output terminal 132. The output circuitry may monitor forward and reflected power or perform other diagnostic measurements. This circuitry forms no part of the present invention.

The entire matching network is air cooled by a pair of fans 248. The fans are affixed to one side of the enclosure 224 and force air through the enclosure.

Figure 3:
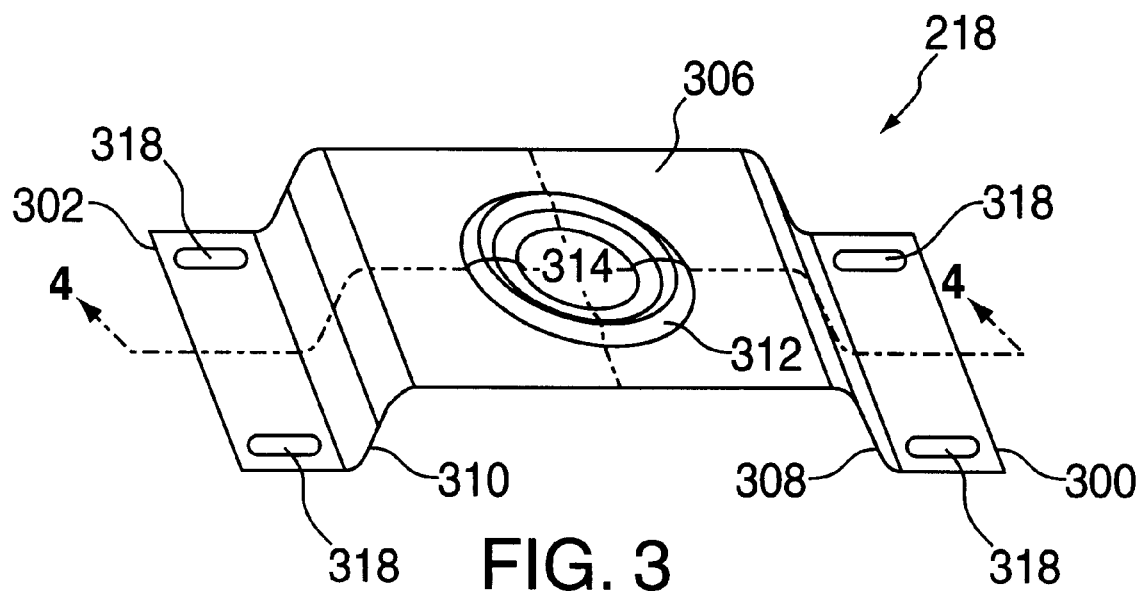
FIG. 3 depicts a perspective view of the slip ring of the air variable capacitor of FIG. 2.
Figure 4:
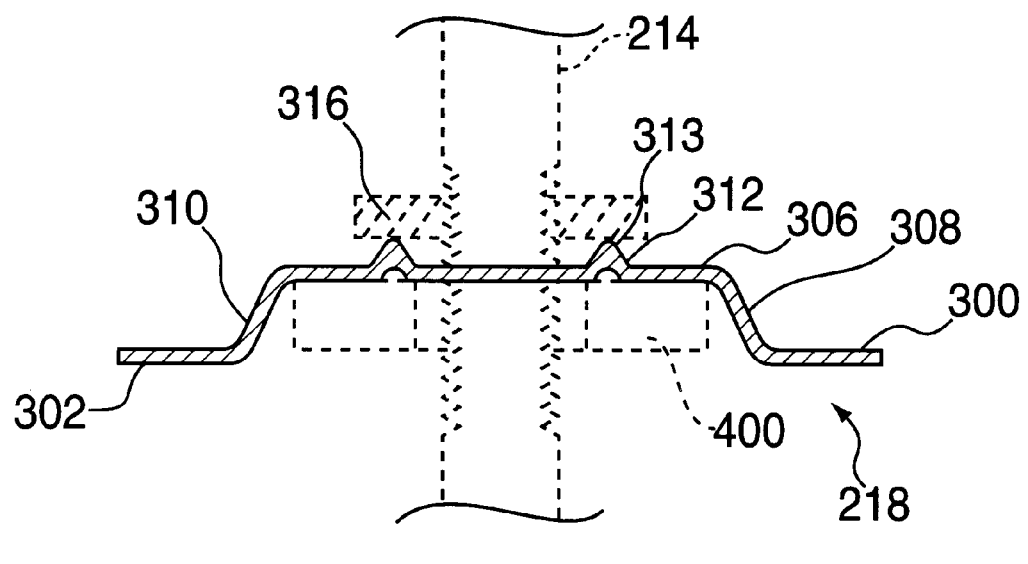
FIG. 4 depicts a cross-sectional view of the slip ring taken along line 4—4 of FIG. 3.

FIG. 3 depicts a perspective view of the slip ring 218 and FIG. 4 depicts a cross sectional view of the slip ring 218. To best understand the inventive slip ring, the reader should simultaneously refer to both FIGS. 3 and 4 while reading the following description.

The slip ring 218 contains a pair of attachment flanges 300 and 302, risers 308 and 310, support member 306, beveled annulus 312, and an aperture 314. The slip ring is fabricated from beryllium-copper (Be—Cu) sheet stock that is die-cut to produce aperture 314 and the four mounting holes 318. Thereafter, the die-cut sheet stock is pressed into the depicted form. Each riser 310 and 308 respectively connect a flange 302 and 300 to the support member 306. The component elements of the slip ring together provide a spring tension (a biasing element) that pushes the beveled annulus against a rotor contact element, e.g., a shaft support nut 316 on shaft 214. Alternatively, a single riser 308 connecting a single flange 300 to the support member 306 could also be used in some applications. Moreover, in other applications, a resilient bias element (annular rubber element 400 shown in phantom) can be used to further support and bias the member 306 against the rotor contact element when either single or dual risers are used.

Specifically, the risers position the support member approximately 0.32 inches (0.81 cm) above the plane of the attachment flanges. The beveled annulus 312 is centrally formed in the support member 306. The beveled annulus circumscribes and defines the aperture 314. The aperture has a radius defined by the diameter of the rotatable shaft 214 of the air variable capacitor, e.g., 0.455 inches (1.16 cm). The beveled annulus, in cross-section, forms a triangle having sides sloped at 74 degrees and a fillet 313 at the triangle's apex with a radius of 0.0150 inches (0.04 cm). Of course, the bevel may have any other cross-sectional shape including semicircular, semi-oval, and the like. The apex of the bevel contacts the rotor contact element, e.g., the conductive nut 316 at the fillet 313. This nut is generally fabricated of a material known as Oilyte and is threaded onto the shaft 214. As such, the nut-to-apex contact couples RF power from the source to the rotor of the air variable capacitor. A relatively small radius fillet minimizes the friction between the nut and the slip ring thus promotes a smooth tuning motion. Furthermore, the small radius promotes efficient coupling of the RF power into the capacitor and also reduces the probability that contaminants will form at the junction between the nut and beveled annulus and interfere with RF coupling.

Figure 5:
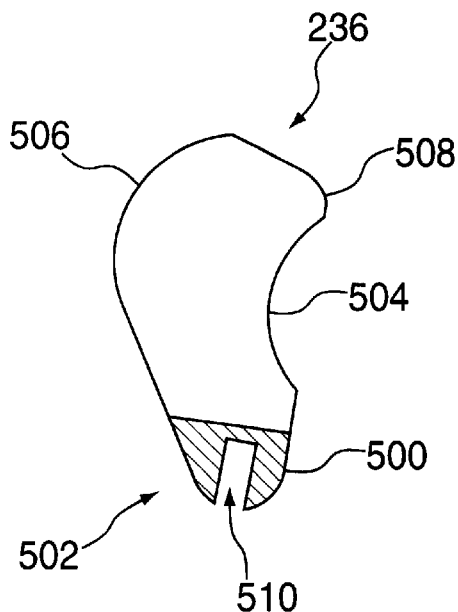
FIG. 5 depicts a top plan view of an inductive tuning element.

FIG. 5 depicts a plan view of a inductor tuning element 236. The tuning element contains a low mass, insulator core that is plated with a conductive material. Since the skin effect of RF signals causes the signals to penetrate into only a fraction of the thickness of the tuning element, the elements are plated with a conductive material to a thickness that is deeper than the expected skin effect. Such a plated tuning element having a low mass core lowers the tuning element moment of inertia to facilitate rapid and accurate rotation during tuning.

Specifically, the core 500 is a low mass material such as an FR-4 glass epoxy laminate having a thickness of approximately 0.063 inches (0.16 cm). The laminate is clad with 0.5 oz. copper cladding and then plated with 2 ounces of copper on both sides as well as the edges. To facilitate adhering the tuning element 236 to the tuning shaft, one end 502 of the tuning element 236 is neither clad nor plated. As such, epoxy adheres to the core material to affix the tuning element to the shaft.

The tuning element has a plan form (a sickle shape) that promotes efficient coupling of the RF power to the tuning element. Specifically, the tuning element has an inside edge 504 having an arcuate form with a radius of 1.025 inches (2.6 cm) and an outer edge 506 having an arcuate form with a similar radius. The outer edge 506 meets the inner edge 504 at a rounded corner 508. A slot 510 is cut into one end of the tuning element (an end opposite the corner 508) to facilitate mounting to the rotatable tuning shaft (see FIG. 6).

Figure 7:
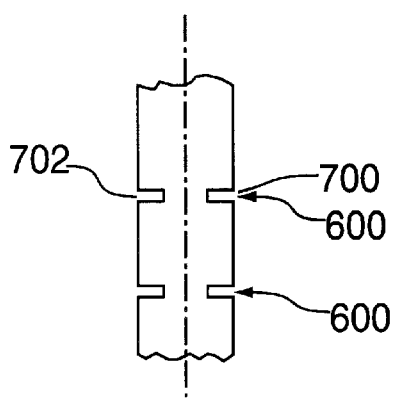
FIG. 7 depicts a detailed perspective view of the tuning element mounting shaft taken along lines 7—7 in FIG. 6.
Figure 6:
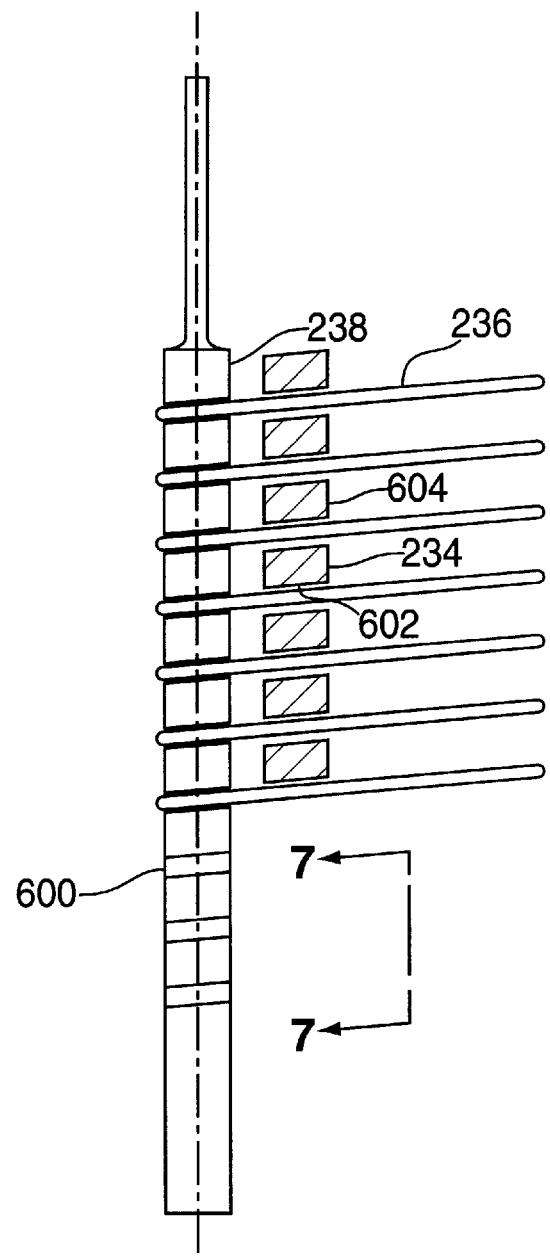
FIG. 6 depicts a perspective view of the inductive tuning element assembly.

FIG. 6 depicts a tuning shaft 238 of the variable inductor 116. To facilitate understanding of the invention, the shaft 238 is depicted with a number of tuning elements 236 attached to the shaft as well as a number of empty mounting slots 600. Furthermore, to depict the relative locations of the coil to the tuning elements, FIG. 6 depicts a partial cross-section of the coil 234. FIG. 7 is a detailed view of the mounting slots 600 viewed along line 7—7 in FIG. 6. To best understand the invention, the reader should simultaneously refer to FIGS. 6 and 7.

The shaft 238 contains a plurality of mounting slots 600 (e.g., nine slots) that are cut into the shaft at a predefined angle (e.g., 6.58 degrees) relative to the axis of rotation of the shaft. The angle matches the angle of the coils 234 between which the tuning elements are interspersed. As such, the tuning element 236 is parallel to the plane of the coil 234. Each mounting slot 600 is a pair of slots 700 and 702 cut into each side of the shaft such that the slot (510 in FIG. 5) in each of the tuning elements 236 interfits the shaft 238. The tuning elements are attached to the shaft using epoxy. The shaft is fabricated from fiberglass, G-10. The slots are spaced apart (e.g., 0.577 inches apart) such that the tuning elements will extend between the individual turns of the coil 234.

The coil 234 has a rectangular cross-section with a long side 602 being parallel to a tuning element 236, e.g., a cross-section with dimensions 0.228 inches (0.58 cm) by 0.325 inches (0.83 cm). Since, with the tuning element engaged in the coil, the greatest amount of current density flows in the surface of the coil facing a tuning element, an increase in the side 602 of the coil facing the tuning element improves the efficiency of the variable inductor. In addition, with the tuning element disengaged from the coil, the greatest amount of current density flows in the surface 604 facing the center line of the coil. Therefore, an increase in the coil thickness improves efficiency of the variable inductor, i.e., the fixed resistance component is reduced. Although rectangular coil cross-section is preferred, a square cross-section can also be used.

FIG. 8 depicts an insulative stand-off 230 for mounting the coil (234 in FIG. 2) to the enclosure. The stand-off 230 has a cylindrical form and is fabricated of ULTEM-1000. The stand-off is machined to have a knurled bore 806 in a first end 800 and a threaded bore 804 in a second end 802. The bore 804 is threaded to interfit a bolt (not shown) that attaches the standoff to the enclosure. The knurled bore 806 is fitted with a conductive insert 808. The insert 808 has a knurled extension 810 that press fits into the knurled bore 806. A flange 812 radially extends from the extension and abuts end 800. Extending centrally from the flange is a threaded pin 814. The coil is inserted over this threaded pin and fastened with a nut. To reduce the possibility of arcing within the standoff, the end 816 of knurled extension 810 is within 0.01 inches of the bottom 818 of the knurled bore 806. Additionally, a plate 820 is positioned at the bottom of bore 804. The maximum electric field forms longitudinally along the central axis of the cylindrical standoff. Specifically, the electric field forms between the bottom 816 of the knurled extension 806 and the plate 820. Any substantial air gap at the bottom of the knurled extension of the plate will breakdown and cause arcing. As such, the coil is maintained in a spaced-apart relation to the enclosure.

To facilitate further reduction in the resistance of the match unit, the enclosure is fabricated of an aluminum alloy and the entire interior is hard black anodized. Conventional chromate surface finishes were found to contribute significant losses to matching network efficiency. The black anodized coating provides a dielectric layer at the enclosure surface facing high RF fields. A clean metal/dielectric interface minimizes the semiconductive surface layer that contributes to losses. Empirical studies indicate that such black anodization improves the efficiency of the matching network by 5 to 10 percent over an enclosure having a bare metal interior surface.

The matching network of the present invention has a loop resistance that is substantially less than the loop resistance of the previously available P5000 matching network manufactured by Applied Materials, Inc. In particular, the present invention has a loop resistance of as low as 0.30 ohms, while P5000 matching network has a loop resistance of approximately 1.35 ohms. The resistance is measured by terminating the match unit with a vacuum capacitor ($C_{term}$) (approximately 50 pf) and measuring the one-port reflection coefficient at the input to the match unit using a network analyzer. The tuning elements are adjusted to the desired position for making the measurement and the frequency is swept until resonance is achieved. Then the capacitor in the match unit is tuned until the reflection coefficient is less than −50 db. The frequency at minimum reflected power (fo) is noted. Thereafter, the network analyzer is disconnected and the input capacitance ($C_{in}$) to the match unit is measured using an LCR meter at 1 KHz (i.e., the match unit inductor is a short at 1 KHz). The loop resistance of the matching network is calculated using:

$$R_m = \frac{R_0}{1+\left(\frac{R_0}{X_0}\right)^2}\sqrt{\frac{13.56\text{MHz}}{f_0}}$$

where:

$R_o$=50 ohms $$X_0 = \frac{1}{2\pi f_0 C_0}$$

$C_o = C_{in} - C_{term}$ $f_o$=Frequency at minimum reflected power

In addition to a lower loop resistance, the improved efficiency is also evident in the fact that the coil of the P5000 matching unit operates at 105° F. and the coil of the present invention operates at 51° F. This efficiency corresponds to an increased etch rate of 5 to 25 percent when the matching network is used to couple RF power to a semiconductor wafer processing plasma. Furthermore, such improved efficiency results in a lower operating temperature, increased power availability to the load, and improved reliability.

Although various embodiments which incorporate the teachings of the present invention have been shown and described in detail herein, those skilled in the art can readily devise many other varied embodiments that still incorporate these teachings.

What is claimed is:

1. Apparatus for matching a first impedance to a second impedance comprising:

a capacitor; and a variable inductor, coupled to said capacitor, having a coil with a plurality of individual coil turns and a shaft supporting a plurality of inductor tuning elements, where each of the inductor tuning elements extends between a pair of coil turns and each of said inductor tuning elements contains a non-conductive core material coated with a layer of conductive material.

2. The apparatus of claim 1 wherein each of said tuning elements has a sickle-shaped plan form defined by an outer arcuate edge and an inner arcuate edge, where the inner arcuate edge and the outer arcuate edge intersect at a rounded corner located at a distal end of each of said tuning elements.

3. The apparatus of claim 1 wherein said capacitor is a variable capacitor.

4. The apparatus of claim 3 wherein said variable capacitor is connected from an input port to ground and said variable inductor is coupled from the input port to an output port, where said input port is coupled to said first impedance and said output port is coupled to said second impedance.

5. The apparatus of claim 1 wherein said coil has a rectangular-shaped cross-section, where long sides of said coil are parallel to each of said tuning elements.

6. The apparatus of claim 5 wherein the shaft supports each of the tuning elements at an angle, where a plane of each of the tuning elements is parallel to a plane of each of the individual coil turns.

7. The apparatus of claim 1 wherein the non-conductive core material is fiberglass and the conductive layer is copper.

8. The apparatus of claim 1 further comprising:

a non-conductive stand-off supporting said coil in a spaced-apart relation relative to an interior surface of an enclosure, where said stand-off has a first end and a second end, said first end contains a bore that retains a conductive coupler and said second end contains a plate at a bottom of said bore.

9. The apparatus of claim 1 further comprising a conductive housing for enclosing the capacitor and variable inductor, where said housing has an interior surface that is black anodized.

10. The apparatus of claim 1 wherein the coil is bright etched and epoxy coated.

11. Apparatus for matching a first impedance to a second impedance comprising:

at least one tunable element for coupling a signal from an input port to an output port; and an enclosure, housing said at least one tunable element, having an interior surface that is black anodized.

12. Apparatus for matching a first impedance to a second impedance comprising:

a capacitor; and a variable inductor, coupled to said capacitor, having a coil with a plurality of individual coil turns and a shaft supporting a plurality of inductive tuning elements, where each of the inductive tuning elements extends between a pair of coil turns, and said coil has a rectangular-shaped cross-section, where long sides of said coil are parallel to each of said tuning elements.

13. The apparatus of claim 12 wherein the shaft supports each of the tuning elements at an angle, where a plane of each of the tuning elements is parallel to a plane of each of the individual coil turns.

14. The apparatus of claim 13 wherein the coil is bright etched and sealed with epoxy.

* * * * *